(12) United States Patent
Watanabe et al.

(10) Patent No.: US 9,118,167 B2
(45) Date of Patent: Aug. 25, 2015

(54) VERTICAL CAVITY SURFACE EMITTING LASER

(71) Applicant: MURATA MANUFACTURING CO., LTD., Nagaokakyo-shi, Kyoto (JP)

(72) Inventors: Hiroshi Watanabe, Nagaokakyo (JP); Atsushi Tate, Chigasaki (JP); Takayuki Kona, Nagaokakyo (JP); Ippei Matsubara, Nagaokakyo (JP); Keiji Iwata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/447,528

(22) Filed: Jul. 30, 2014

(65) Prior Publication Data

US 2014/0341246 A1 Nov. 20, 2014

Related U.S. Application Data

(63) Continuation of application No. PCT/JP2013/055069, filed on Feb. 27, 2013.

(30) Foreign Application Priority Data

Mar. 2, 2012 (JP) ................. 2012-046005

(51) Int. Cl.
*H01S 5/00* (2006.01)
*H01S 5/183* (2006.01)
(Continued)

(52) U.S. Cl.
CPC ............ *H01S 5/18377* (2013.01); *B82Y 20/00* (2013.01); *H01S 5/187* (2013.01);
(Continued)

(58) Field of Classification Search
CPC .... H01S 5/187; H01S 5/3432; H01S 5/18377
USPC ....................................... 372/45.01
See application file for complete search history.

(56) References Cited

U.S. PATENT DOCUMENTS

| 5,838,705 A | 11/1998 | Shieh et al. |
| 2002/0154675 A1 | 10/2002 | Deng et al. |
| 2002/0163950 A1 | 11/2002 | Johnson et al. |

FOREIGN PATENT DOCUMENTS

| JP | 10-303507 A | 11/1998 | |
| JP | 2002-329929 | * 11/2002 | ............. H01S 5/183 |

(Continued)

OTHER PUBLICATIONS

International Search Report; PCT/JP2013/055069; May 14, 2013.
Written Opinion of the International Search Report; PCT/JP2013/055069; May 14, 2013.

*Primary Examiner* — Tuan Nguyen
(74) *Attorney, Agent, or Firm* — Studebaker & Brackett PC

(57) ABSTRACT

A vertical cavity surface emitting laser includes an active layer that includes a quantum well, a first cladding layer and a second cladding layer between which the active layer is interposed. A first multilayer reflector layer is arranged on a side of the first cladding layer opposite to that on which the active layer is arranged. A second multilayer reflector layer is arranged on a side of the second cladding layer opposite to that on which the active layer is arranged. At least one of the first cladding layer and the second cladding layer includes a low activity energy layer having a band gap that is smaller than a smallest band gap of an optical confinement layer for forming the quantum well of the active layer and larger than a band gap of the quantum well.

16 Claims, 9 Drawing Sheets

(51) Int. Cl.
   *H01S 5/32*    (2006.01)
   *B82Y 20/00*   (2011.01)
   *H01S 5/187*   (2006.01)
   *H01S 5/343*   (2006.01)

(52) U.S. Cl.
   CPC .......... *H01S 5/18358* (2013.01); *H01S 5/3201* (2013.01); *H01S 5/0021* (2013.01); *H01S 5/18311* (2013.01); *H01S 5/3213* (2013.01); *H01S 5/3432* (2013.01); *H01S 2301/176* (2013.01)

(56) References Cited

FOREIGN PATENT DOCUMENTS

| | | | | |
|---|---|---|---|---|
| JP | 2002-329929 A | 11/2002 | | |
| JP | 2003-508928 A | 3/2003 | | |
| JP | 2004-103677 A | 4/2004 | | |
| JP | 2004-179640 | * 6/2004 | .............. | H01S 5/187 |
| JP | 2004-179640 A | 6/2004 | | |
| JP | 2004-281969 | * 10/2004 | .............. | H01S 5/183 |
| JP | 2004-281969 A | 10/2004 | | |

* cited by examiner

CURRENT PATH

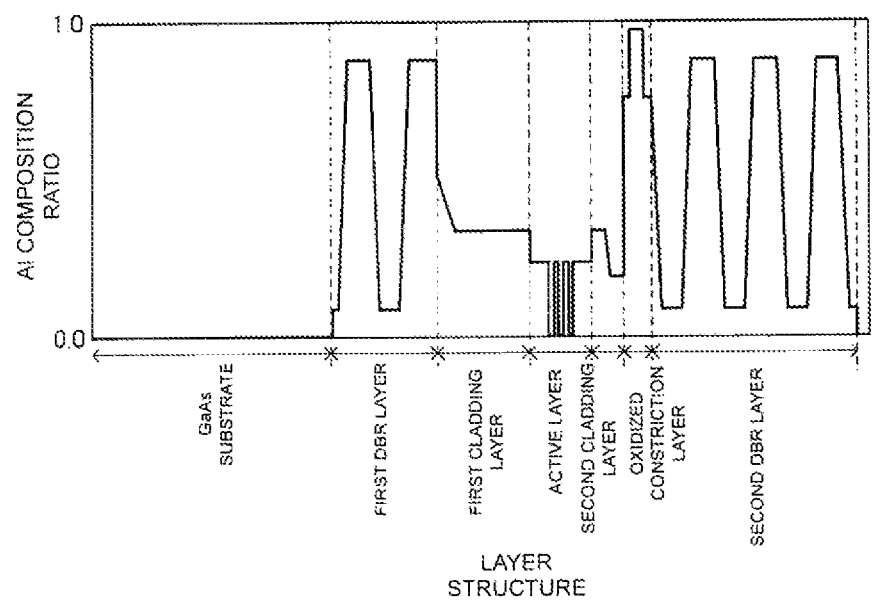

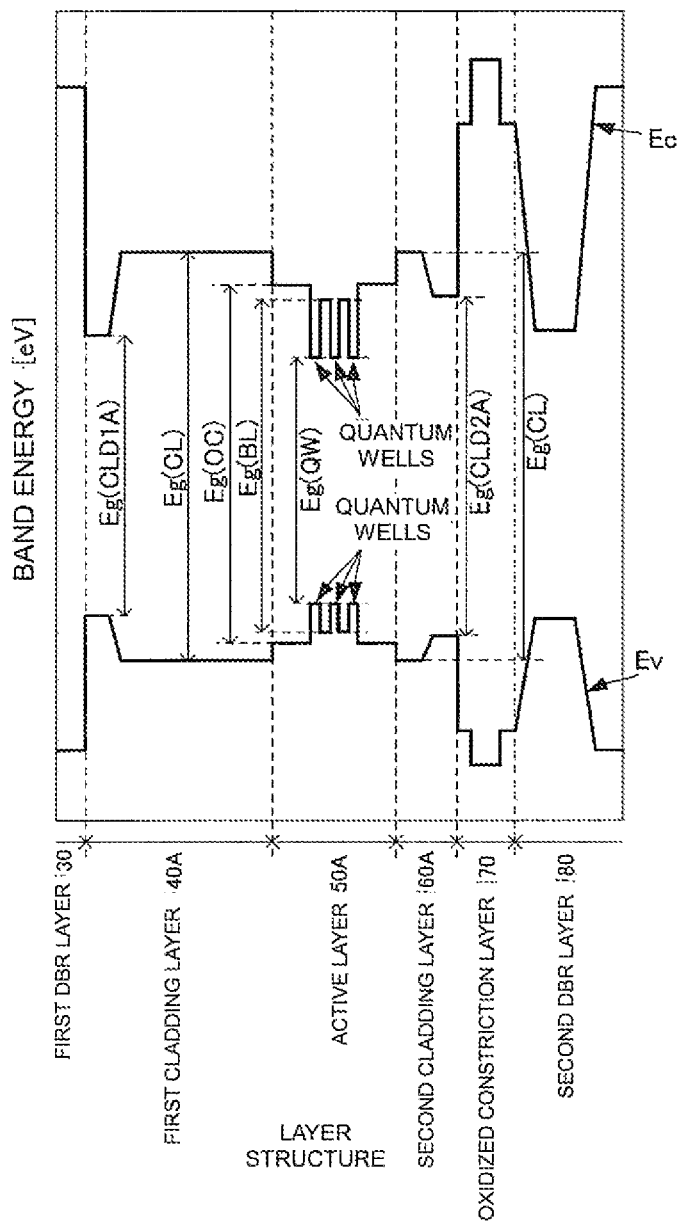

VERTICAL CAVITY SURFACE EMITTING LASER

CROSS REFERENCE TO RELATED APPLICATIONS

This application claims benefit of priority to Japanese Patent Application No. 2012-046005 filed on Mar. 2, 2012, and to International Patent Application No. PCT/JP2013/055069 filed on Feb. 27, 2013, the entire content of each of which is incorporated herein by reference.

TECHNICAL FIELD

The present technical field relates to vertical cavity surface emitting lasers in which light is caused to resonate in a direction orthogonal to a substrate surface and is then emitted in the orthogonal direction.

BACKGROUND

Currently, vertical cavity surface emitting lasers (VCSELs) are implemented as one type of semiconductor laser.

In the basic structure of a vertical cavity surface emitting laser, a first multilayer distributed Bragg reflector (DBR) layer is formed on an insulating substrate having a lower electrode formed on a back surface thereof, as illustrated in Japanese Unexamined Patent Application Publication (Translation of PCT Application) No. 2003-508928 for example. A first spacer layer is formed on the first multilayer distributed Bragg reflector (DBR) layer. An active layer equipped with a quantum well is formed on the first spacer layer. A second spacer layer is formed on the active layer. A second DBR layer is formed on the second spacer layer. An upper electrode is formed on the second DBR layer. Then, laser light having sharp directivity in a direction orthogonal to the substrate (direction parallel to stacking direction) is generated by applying a driving signal between the upper electrode and the lower electrode.

In such a vertical cavity surface emitting laser, the current density supplied to the active layer is increased while the current consumed is decreased and therefore in the vertical cavity surface emitting laser of Japanese Unexamined Patent Application Publication (Translation of PCT Application) No. 2003-508928 a region is formed in the second DBR layer in which a current aperture is narrowed by an oxidized layer.

SUMMARY

Technical Problem

However, in the vertical cavity surface emitting laser having the above-described configuration, generally, the composition of the material that forms the layer that contains the active layer and the composition of the material that forms the spacer layers and the DBR layers as in Japanese Unexamined Patent Application Publication (Translation of PCT Application) No. 2003-508928 are different and therefore stress and strain are generated due to lattice mismatching. Consequently, the effect of the stress and strain is accelerated by conduction of electricity, the active layer is adversely affected and the electro-optical conversion efficiency may be decreased. In addition, in the case where a region is provided in which a current aperture is narrowed by an oxidized layer as described in the above-mentioned Japanese Unexamined Patent Application Publication (Translation of PCT Application) No. 2003-508928, the effect of stress and strain generated as a result of the formation of the oxidized layer may be accelerated by conduction of electricity, the active layer may be adversely affected and the electro-optical conversion efficiency may be decreased.

An object of the present disclosure is to realize a vertical cavity surface emitting laser having high reliability in which the electro-optical conversion efficiency is not decreased even with the continuous conduction of electricity.

Solution to Problem

The present disclosure relates to a vertical cavity surface emitting laser having a layered structure. The layered structure is made up of an active layer that includes a quantum well, a first cladding layer and a second cladding layer between which the active layer is interposed, a first multilayer reflector layer arranged on a side of the first cladding layer opposite to that on which the active layer is arranged, a second multilayer reflector layer arranged on a side of the second cladding layer opposite to that on which the active layer is arranged, a first electrode that is connected to the first cladding layer of the first multilayer reflector layer, and a second electrode that is connected to the second cladding layer of the second multilayer reflector layer. The vertical cavity surface emitting laser has the following characteristics. At least one of the first cladding layer and the second cladding layer includes a low activity energy layer having a band gap that is smaller than a smallest band gap of a optical confinement layer for forming the quantum well of the active layer and that is larger than a band gap of the quantum well.

With this configuration, propagation of stress and strain, which is caused by lattice mismatching, to the active layer is suppressed by providing the low activity energy layer. Thus, a decrease in the electro-optical conversion efficiency with the continuous conduction of electricity is suppressed.

In addition, it is preferable that the vertical surface emitting laser of the present disclosure have the following configuration. An oxidized constriction layer is provided between the second cladding layer and the second multilayer reflector layer. A low activity energy layer is formed in the second cladding layer.

With this configuration, by providing the oxidized constriction layer, power consumption can be reduced and propagation of stress and strain originating in the oxidized constriction layer to the active layer is suppressed.

In addition, in the vertical surface emitting laser of the present disclosure, it is preferable that the low activity energy layer of the second cladding layer be formed at a side of the second cladding layer opposite to that on which the active layer is arranged.

With this configuration, a specific formation position of the low activity energy layer inside the second cladding layer is illustrated. By spacing the low activity energy layer apart from the active layer in this way, suppression of reduction of the electro-optical conversion efficiency can be effectively realized.

In addition, in the vertical surface emitting laser of the present disclosure, it is preferable that a low activity energy layer be formed in both the first cladding layer and the second cladding layer.

With this configuration, propagation of stress and strain to the active layer is suppressed from both sides of the active layer. Thus, suppression of reduction of the electro-optical conversion efficiency can be realized with more certainty.

In addition, in the vertical surface emitting laser of the present disclosure, it is preferable that a band gap of the low activity energy layer formed in the first cladding layer be smaller than a band gap of the low activity energy layer formed in the second cladding layer.

With this configuration, a more effective form of the low activity energy layers is illustrated.

In addition, in the vertical surface emitting laser of the present disclosure, it is preferable that the active layer include a plurality of quantum wells and that the band gap of the low activity energy layer of the first cladding layer be smaller than a band gap of a barrier layer between the plurality of quantum wells.

In addition, in the vertical surface emitting laser of the present disclosure, it is preferable that a band gap of the low activity energy layer of the first cladding layer and a band gap of the low activity energy layer of the second cladding layer are smaller than a band gap of the barrier layer.

By making the band gaps of the low activity energy layers be smaller than the band gap of the barrier layer as in these configurations, suppression of reduction of the electro-optical conversion efficiency can be realized with more certainty. In particular, suppression of reduction of the electro-optical conversion efficiency can be realized with even more certainty by making the band gaps of both the low activity energy layers of the first and second cladding layers be smaller than the band gap of the barrier layer.

In addition, the vertical surface emitting laser of the present disclosure may have the following configuration. A low activity energy layer is formed in only the first cladding layer. The low activity energy layer of the first cladding layer is formed at a side of the first cladding layer opposite to that on which the active layer is arranged.

With this configuration, propagation of stress and strain, which originate in the substrate, to the active layer is suppressed.

In addition, the vertical surface emitting laser of the present disclosure may have the following configuration. A low activity energy layer is formed in only the first cladding layer. The active layer includes a plurality of quantum wells. A band gap of the low activity energy layer of the first cladding layer is smaller than a band gap of a barrier layer between the plurality of quantum wells.

By making the band gap of the low activity energy layer be smaller than the band gap of the barrier layer as in this configuration, suppression of reduction of the electro-optical conversion efficiency can be realized with more certainty.

In addition, the present disclosure relates to a vertical cavity surface emitting laser having a layered structure. The layered structure is made up of an active layer that includes a quantum well, a first cladding layer and a second cladding layer between which the active layer is interposed, a first multilayer reflector layer arranged on a side of the first cladding layer opposite to that on which the active layer is arranged, a second multilayer reflector layer arranged on a side of the second cladding layer opposite to that on which the active layer is arranged, a first electrode that is connected to the first cladding layer of the first multilayer reflector layer, and a second electrode that is connected to the second cladding layer of the second multilayer reflector layer. The vertical cavity surface emitting laser has the following characteristics. The active layer, the first cladding layer, the second cladding layer, the first multilayer reflector layer and the second multilayer reflector layer are composed of an AlGaAs material. At least one of the first cladding layer and the second cladding layer includes a low activity energy layer having an Al composition ratio that is lower than an Al composition ratio of an optical confinement layer for forming the quantum well of the active layer and higher than an Al composition ratio of the quantum well.

With this configuration, propagation of stress and strain originating in the substrate and so forth to the active layer is suppressed by providing a low activity energy layer having a low Al composition ratio. Thus, a decrease in the electro-optical conversion efficiency with the continuous conduction of electricity is suppressed.

In addition, it is preferable that the vertical cavity surface emitting laser of the present disclosure have the following configuration. An oxidized constriction layer is provided that is arranged between the second cladding layer and the second multilayer reflector layer and has an Al composition ratio that is higher than that of the second multilayer reflector layer. A low activity energy layer is formed in the second cladding layer.

With this configuration, by providing the oxidized constriction layer having a high Al composition ratio, power consumption can be reduced and propagation of stress and strain originating in the oxidized constriction layer to the active layer is suppressed.

In addition, in the vertical surface emitting laser of the present disclosure, it is preferable that the low activity energy layer of the second cladding layer be formed at a side of the second cladding layer opposite to that on which the active layer is arranged.

With this configuration, a specific formation position of the low activity energy layer inside the second cladding layer is illustrated. By spacing the low activity energy layer apart from the active layer in this way, suppression of reduction of the electro-optical conversion efficiency can be effectively realized.

In addition, in the vertical surface emitting laser of the present disclosure, it is preferable that the low activity energy layer be formed in both the first cladding layer and the second cladding layer.

With this configuration, propagation of stress and strain to the active layer is suppressed from both sides of the active layer. Thus, suppression of reduction of the electro-optical conversion efficiency can be realized with more certainty.

In addition, in the vertical surface emitting laser of the present disclosure, it is preferable that an Al composition ratio of the low activity energy layer formed in the first cladding layer be lower than an Al composition ratio of the low activity energy layer formed in the second cladding layer.

With this configuration, a more effective form of the Al composition ratios of the low activity energy layers is illustrated.

In addition, in the vertical surface emitting laser of the present disclosure, it is preferable that the active layer include a plurality of quantum wells and that an Al composition ratio of the low activity energy layer of the first cladding layer be lower than a composition ratio of a barrier layer between the plurality of quantum wells.

In addition, in the vertical surface emitting laser of the present disclosure, it is preferable that an Al composition ratio of the low activity energy layer of the first cladding layer and an Al composition ratio of the low activity energy layer of the second cladding layer be lower than an Al composition ratio of a barrier layer.

By making the Al composition ratios of the low activity energy layers be lower than the Al composition ratio of the barrier layer as in these configurations, suppression of reduction of the electro-optical conversion efficiency can be realized with more certainty. In particular, suppression of reduction of the electro-optical conversion efficiency can be realized with even more certainty by making the Al composition ratios of both the low activity energy layers of the first and second cladding layers be lower than the Al composition ratio of the barrier layer.

In addition, the vertical surface emitting laser of the present disclosure may have the following configuration. A low activity energy layer is formed in only the first cladding layer. The low activity energy layer of the first cladding layer is formed at a side of the first cladding layer opposite to that on which the active layer is arranged.

With this configuration, propagation of stress and strain, which originates in the substrate, to the active layer is suppressed.

In addition, the vertical surface emitting laser of the present disclosure may have the following configuration. A low activity energy layer is formed in only the first cladding layer. The active layer includes a plurality of quantum wells. An Al composition ratio of the low activity energy layer of the first cladding layer is lower than an Al composition ratio of a barrier layer between the plurality of quantum wells.

By making the composition ratio of the low activity energy layer be lower than the Al composition ratio of the barrier layer as in this configuration, suppression of reduction of the electro-optical conversion efficiency can be realized with more certainty.

Advantageous Effects of Disclosure

According to the present disclosure, the electro-optical conversion efficiency substantially does not decrease even with the continuous conduction of electricity through the vertical cavity surface emitting laser. Thus, a vertical cavity surface emitting laser having high reliability can be realized.

BRIEF DESCRIPTION OF THE DRAWINGS

FIGS. 8(A), 8(B) and 8(C) show distribution diagrams of the Al composition ratios (Al content ratios) of vertical cavity surface emitting lasers of the related art.

FIG. 9 is an enlarged view of a region in the vicinity of an active layer 50A in a band energy distribution diagram of a vertical cavity surface emitting laser according to a second embodiment of the present disclosure.

DETAILED DESCRIPTION

Figure 1:
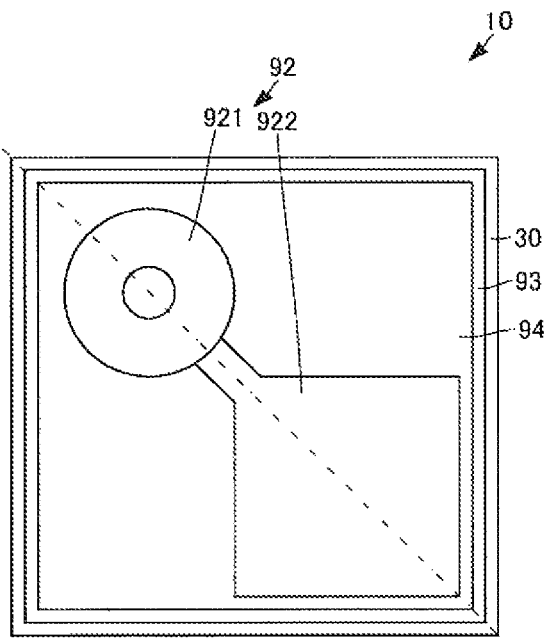
FIG. 1 is a plan view of a vertical cavity surface emitting laser 10 according to a first embodiment of the present disclosure.
Figure 2:
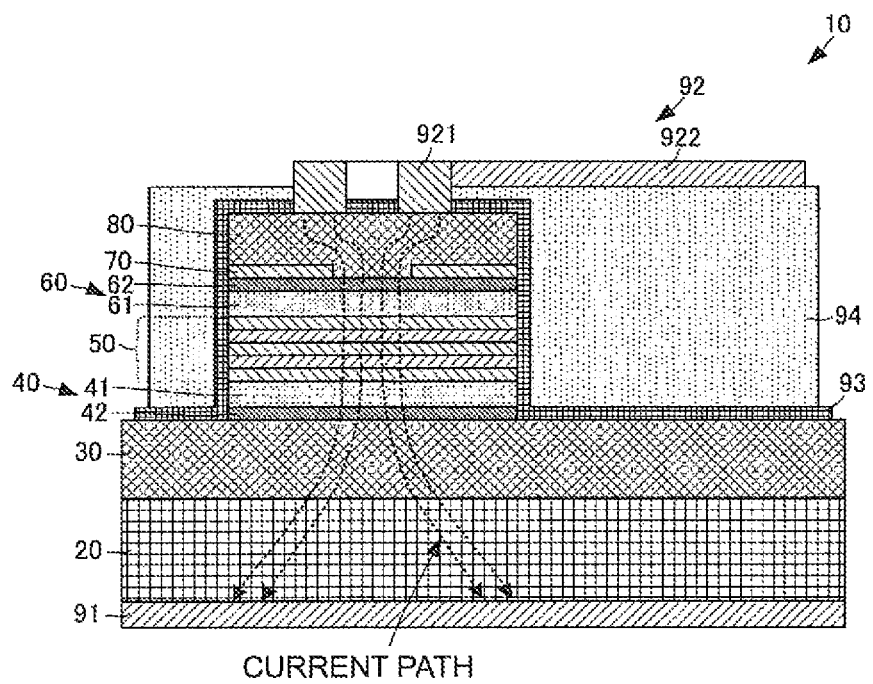
FIG. 2 is a lateral sectional view of the vertical cavity surface emitting laser 10 according to the first embodiment of the present disclosure.
Figure 3:
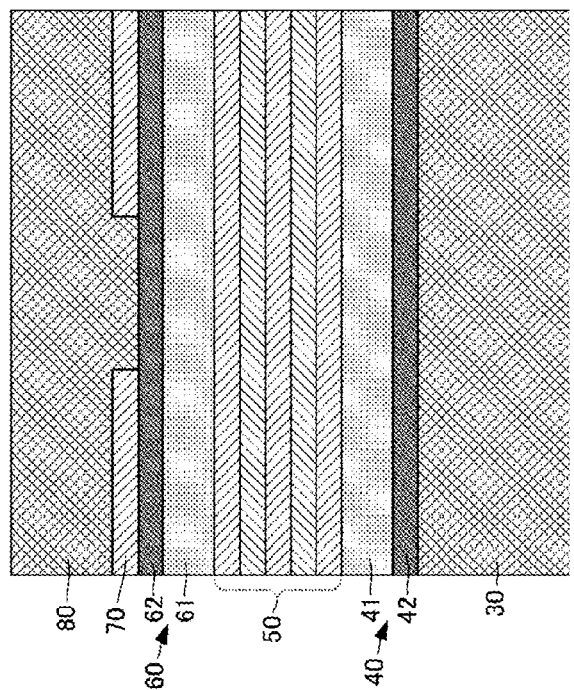
FIG. 3 is a partial enlarged lateral sectional view of the vertical cavity surface emitting laser 10 according to the first embodiment of the present disclosure.

A vertical cavity surface emitting laser (VCSEL) according to a first embodiment of the present disclosure will be described while referring to the drawings. FIG. 1 is a plan view of a vertical cavity surface emitting laser 10 according to the first embodiment of the present disclosure. FIG. 2 is a lateral sectional view of the vertical cavity surface emitting laser 10 according to the first embodiment of the present disclosure. FIG. 3 is a partial enlarged lateral sectional view of the vertical cavity surface emitting laser 10 according to the first embodiment of the present disclosure.

The vertical cavity surface emitting laser 10 is composed of a heterojunction type semiconductor structure illustrated in FIG. 1, FIG. 2 and FIG. 3. The vertical cavity surface emitting laser 10 includes a base substrate 20 composed of GaAs. The base substrate 20 is a flat plate and has a first electrode 91 formed on a lower surface thereof.

A first multilayer distributed Bragg reflector (DBR) layer 30 is formed on an upper surface of the base substrate 20, that is, on a surface on the opposite side to the lower surface on which the first electrode 91 is formed. The first DBR layer 30 is composed of an AlGaAs material and is formed by stacking a plurality of layers having different composition ratios of Al to GaAs on top of one another. A first reflector for generating laser light of a predetermined frequency is formed by this layered structure. The first DBR layer 30 is an n-type DBR layer.

A first cladding layer 40 is formed on a predetermined region of the upper surface (surface on opposite side to surface in contact with the base substrate 20) of the first DBR layer 30. The first cladding layer 40 is also composed of an AlGaAs material. The first cladding layer 40 includes a high activity energy layer 41 and a low activity energy layer 42. The high activity energy layer 41 and the low activity energy layer 42 are each formed in a layer-like shape. The high activity energy layer 41 and the low activity energy layer 42 are arranged so that the low activity energy layer 42 is on the side next to the first DBR layer 30.

An active layer 50 is formed on an upper surface of the first cladding layer 40 (surface on a side opposite to a surface in contact with first DBR layer 30). The active layer 50 is also composed of an AlGaAs material. The active layer 50 has a structure formed by stacking a plurality of layers having different refractive indices on top of one another such that a refractive index distribution is formed in the stacking direction. These layers having different refractive indices are realized by making the composition ratios of Al to GaAs of the layers be different to one another. With this configuration, the active layer 50 becomes a layer containing a single or multiple quantum wells sandwiched between optical confinement layers having a large band gap.

A second cladding layer 60 is formed on an upper surface of the active layer 50 (surface on a side opposite to a surface in contact with the first cladding layer 40). The second cladding layer 60 is also composed of an AlGaAs material. The second cladding layer 60 includes a high activity energy layer 61 and a low activity energy layer 62. The high activity energy layer 61 and the low activity energy layer 62 are each formed in a layer-like shape. The high activity energy layer 61 and the low activity energy layer 62 are arranged so that the high activity energy layer 61 is on the side next to the active layer 50.

A second DBR layer 80 is formed on an upper surface of the second cladding layer 60 (surface on a side opposite to a surface in contact with the active layer 50). The second DBR layer 80 is composed of an AlGaAs material and is formed by stacking a plurality of layers having different composition ratios of Al to GaAs on top of one another. A second reflector for generating laser light of a predetermined frequency is formed by this layered structure. The second DBR layer 80 is a p-type DBR layer. The second DBR layer 80 is formed so as to have a reflectivity that is somewhat lower than that of the first DBR layer 30.

An oxidized constriction layer 70 is formed at an interface between the second cladding layer 60 and the second DBR layer 80. The oxidized constriction layer 70 is formed of an AlGaAs material and is formed such that the composition ratio of Al to GaAs thereof is higher than that of the other layers. The oxidized constriction layer 70 is not formed over the entirety of the interface between the second cladding layer 60 and the second DBR layer 80 and is not formed in a portion having a predetermined area substantially in the center of the region in which it is formed.

A ring electrode 921 is formed on an upper surface of the second DBR layer 80. The ring electrode 921 is an electrode having an annular shape when viewed in plan as illustrated in FIG. 1.

The entirety of a semiconductor functional portion having the above-described layered structure except for the region in which the ring electrode 921 is formed is covered by an insulating layer 93. In addition, an insulating layer 94 is formed such that its height and the height of a region formed from the first cladding layer 40 to the second DBR layer 80 are substantially the same. A pad electrode 922 that is connected to the ring electrode 921 is formed on an upper surface of the insulating layer 94. A second electrode 92 is formed by the ring electrode 921 and the pad electrode 922.

By setting the thickness and the composition ratio of Al to GaAs of each layer such that a plurality of quantum wells having an emission spectral peak wavelength at a position of an antinode in the center of an optical standing wave distribution, this structure is made to function as the vertical cavity surface emitting laser 10. In addition, by providing the above-described oxidized constriction layer 70, a current can be efficiently injected into an active region and a lens effect can be achieved and therefore a vertical cavity surface emitting laser having low power consumption can be realized.

Figure 4:
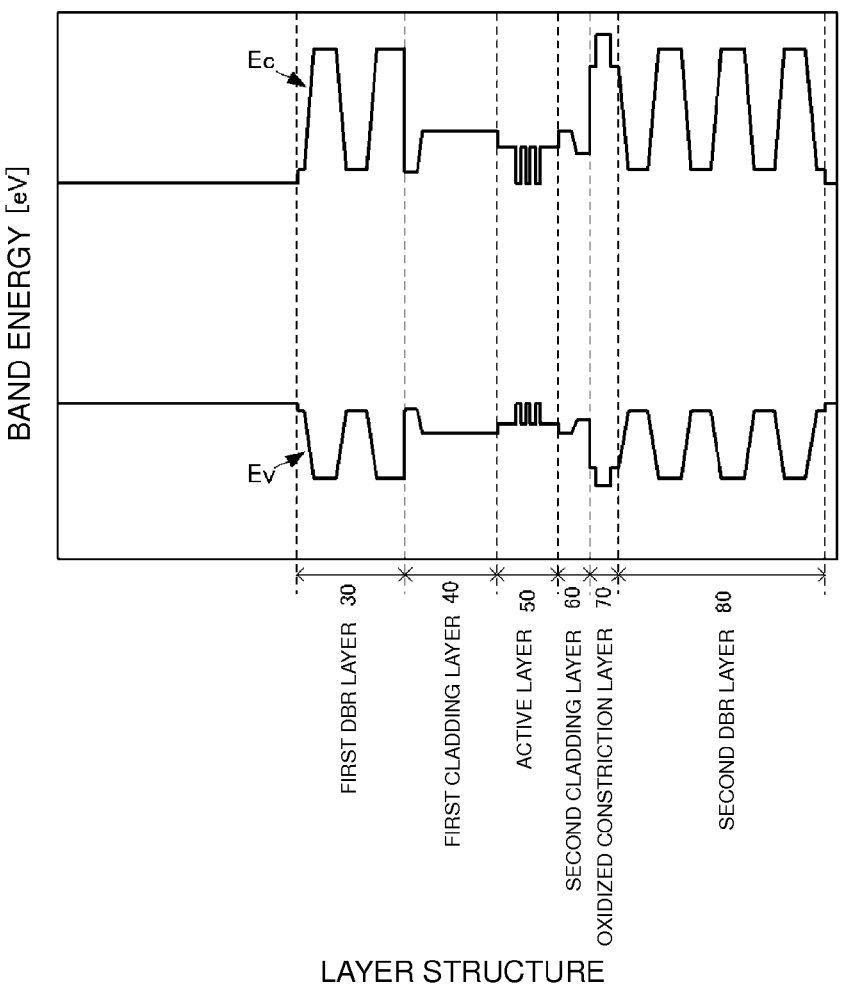
FIG. 4 is a band energy distribution diagram for the vertical cavity surface emitting laser 10 according to the first embodiment of the present invention.
Figure 5:
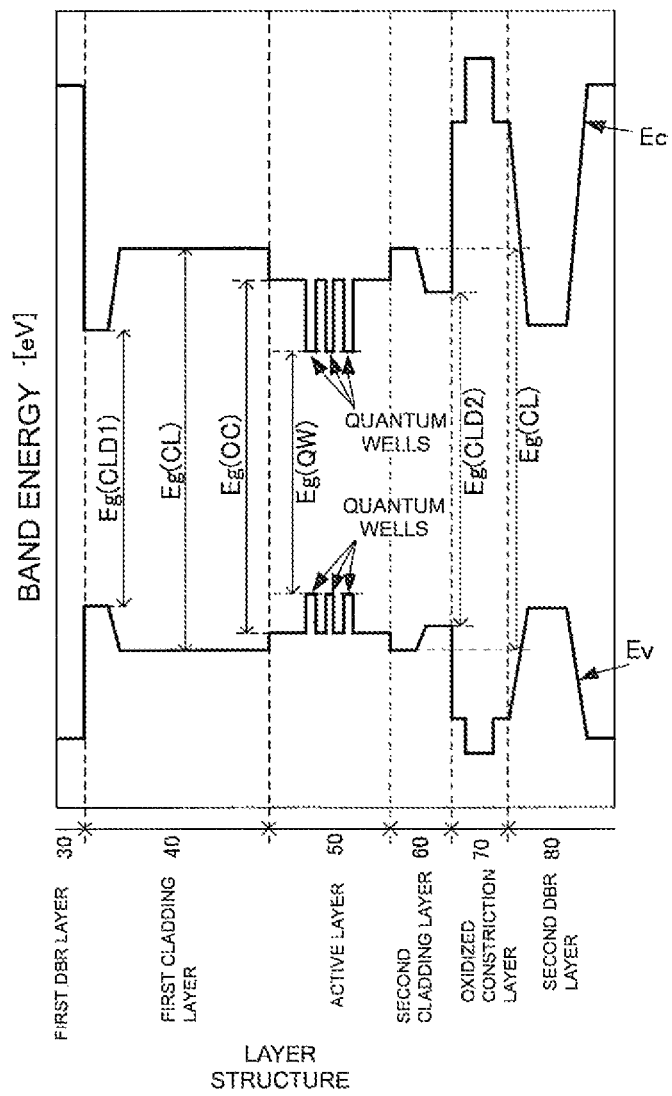
FIG. 5 is an enlarged view of an area of the band energy distribution diagram illustrated in FIG. 4 in the vicinity of an active layer 50.
Figure 6:
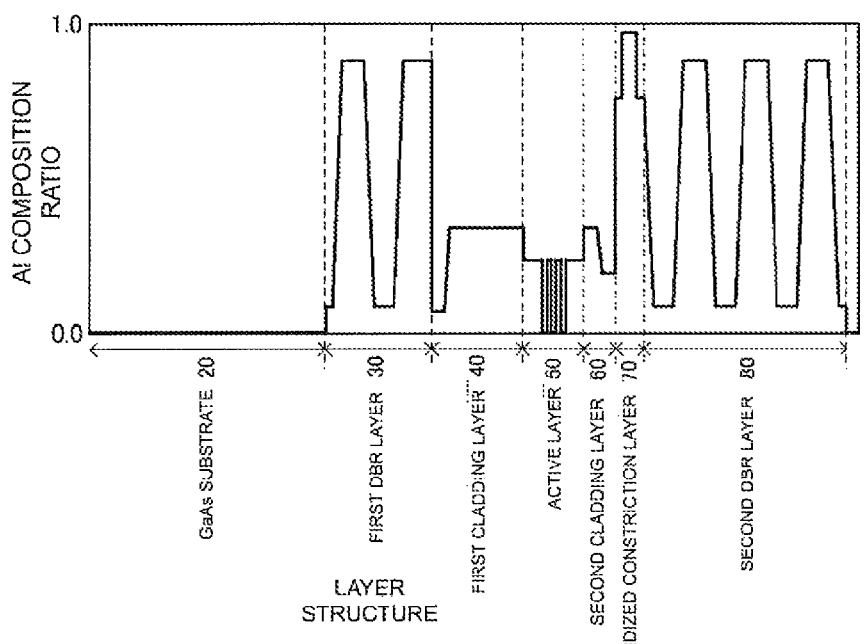
FIG. 6 is a distribution diagram of an Al composition ratio (Al content ratio) of each layer of the vertical cavity surface emitting laser 10 according to the first embodiment of the present disclosure.

In the vertical cavity surface emitting laser 10 of this embodiment, a band gap size relation is determined by setting the composition ratio of Al with respect to GaAs of each layer as will be described next. FIG. 4 is a band energy distribution diagram for the vertical cavity surface emitting laser 10 according to the first embodiment of the present disclosure. FIG. 5 is an enlarged view of an area of the band energy distribution diagram illustrated in FIG. 4 in the vicinity of the active layer 50. FIG. 6 is a distribution diagram of the Al composition ratio (Al content ratio) of each layer of the vertical cavity surface emitting laser 10 according to the first embodiment of the present disclosure.

The substrate 20 is composed of a GaAs material and does not include Al. The first DBR layer 30 has a structure formed by stacking a plurality of layers having markedly different Al composition ratios on top of one another. That is, the first DBR layer 30 has a structure in which a layer having a very high Al composition ratio and a layer having a very low Al composition ratio are alternately stacked on top of one another. Thus, the first DBR layer 30 acts as a reflector to laser light as described above.

The first cladding layer 40 is formed of the high activity energy layer 41, which has a high Al composition ratio and the low activity energy layer 42, which has a low Al composition ratio. Thus, the first cladding layer 40 has a structure composed of the two layers of the high activity energy layer 41, which has a large energy gap, and the low activity energy layer 42, which has a small energy gap.

The active layer 50 has a structure in which a plurality of layers that do not contain Al are interposed between optical confinement layers having a high Al composition ratio. Thus, the active layer 50 has a structure in which a plurality of (multiple) quantum wells are interposed between optical confinement layers having a large energy gap.

Here, an energy gap Eg(CL) of the high activity energy layer 41 of the first cladding layer 40 is set so as to be larger than an energy gap Eg(OC) of the optical confinement layers of the active layer 50. An energy gap Eg(CLD1) of the low activity energy layer 42 of the first cladding layer 40 is set so as to be smaller than the energy gap Eg(OC) of the optical confinement layers and so as to be larger than an energy gap Eg(QW) of a quantum well level.

In other words, the Al composition ratio of the high activity energy layer 41 is set so as to be higher than the Al composition ratio of the optical confinement layers of the active layer 50. In addition, the Al composition ratio of the low activity energy layer 42 is set to be lower than the Al composition ratio of the optical confinement layers and so as to be higher than the Al composition ratio of the quantum well level.

With this configuration, it is considered that the effect of stress and strain originating in the substrate 20 and the first DBR layer 30 on the active layer 50 due to the continuous conduction of electricity is suppressed. At this time, the effect can be more effectively suppressed by arranging the low activity energy layer 42 on the side next to the first DBR layer 30 as in the vertical cavity surface emitting laser 10 of this embodiment.

The second cladding layer 60 is formed of the high activity energy layer 61, which has a high Al composition ratio, and the low activity energy layer 62, which has a low Al composition ratio. Thus, the second cladding layer 60 has a structure composed of the two layers of the high activity energy layer 61, which has a large energy gap, and the low activity energy layer 62, which has a small energy gap.

Here, an energy gap Eg(CL) of the high activity energy layer 61 of the second cladding layer 60 is set so as to be larger than an energy gap Eg(OC) of the optical confinement layers of the active layer 50. An energy gap Eg(CLD2) of the low activity energy layer 62 of the second cladding layer 60 is set so as to be smaller than the energy gap Eg(OC) of the optical confinement layers and so as to be larger than an energy gap Eg(QW) of the quantum well level.

In other words, the Al composition ratio of the high activity energy layer 61 is set so as to be higher than the Al composition ratio of the optical confinement layers of the active layer 50. In addition, the Al composition ratio of the low activity energy layer 62 is set to be lower than the Al composition ratio of the optical confinement layers and so as to be higher than the Al composition ratio of the quantum well level.

With this configuration, it is considered that the effect of stress and strain originating in the oxidized constriction layer 70 and the second DBR layer 80 on the active layer 50 due to the continuous conduction of electricity is suppressed. At this time, the effect can be more effectively suppressed by arranging the low activity energy layer 62 on the side next to the oxidized constriction layer 70 and second DBR layer 80 as in the vertical cavity surface emitting laser 10 of this embodiment.

In addition, the Al composition ratios (content ratios) of the low activity energy layers 42 and 62 are low and therefore the thermal conductivities of the first and second cladding layers 40 and 60 are improved. Thus, heat generated in the active layer 50 is able to be efficiently conducted to the outside and degradation of laser characteristics can be suppressed.

In addition, an unintended increase in impurities (dopants) can be prevented since the Al composition ratios of the low activity energy layers 42 and 62 are low. Thus, good crystallinity can be realized for the semiconductor epistructure used to realize the vertical cavity surface emitting laser 10.

Figure 7:
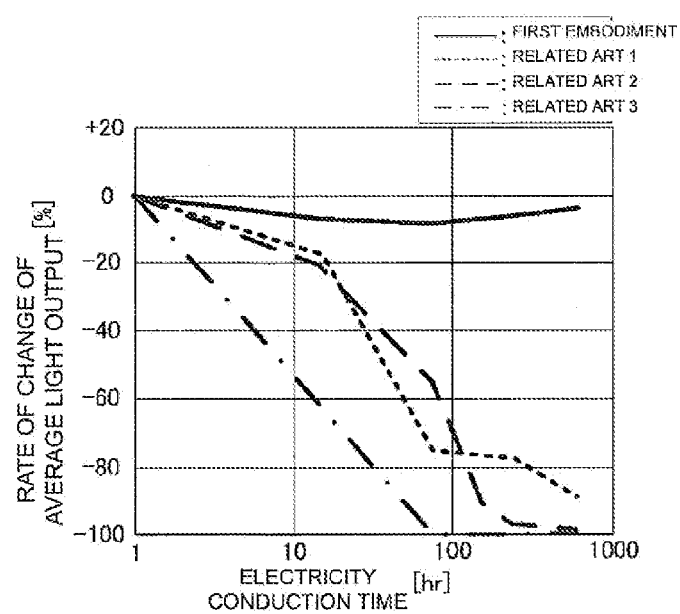
FIG. 7 is a characteristics diagram illustrating changes in average light output with continuous conduction of electricity for the vertical cavity surface emitting laser 10 according to the first embodiment of the present disclosure and vertical cavity surface emitting lasers having cladding layer structures of the related art.

FIG. 7 is a characteristics diagram illustrating changes in average light output with continuous conduction of electricity for the vertical cavity surface emitting laser 10 according to the first embodiment of the present disclosure and for vertical cavity surface emitting lasers having cladding layer structures of the related art. Results for an electricity conduction experiment performed at a high temperature of 150° C. are given.

Figure 8A:
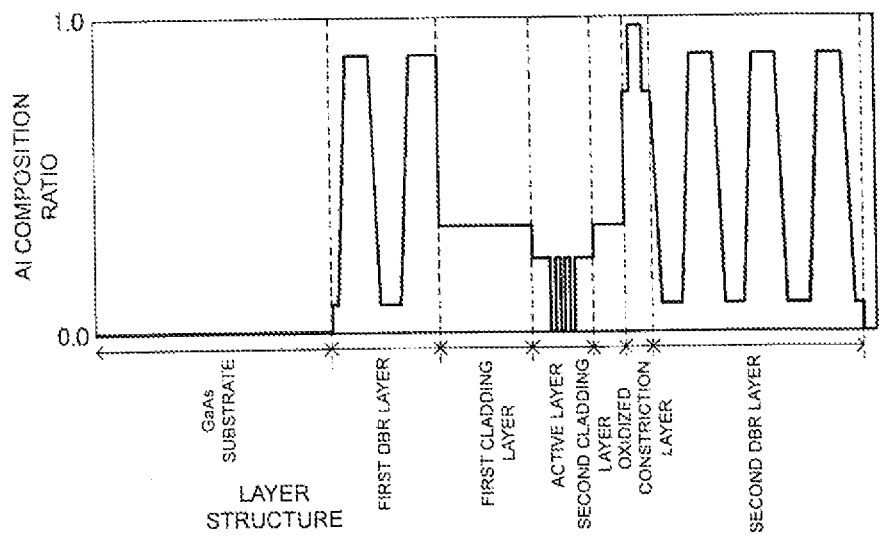
Figure 8B:
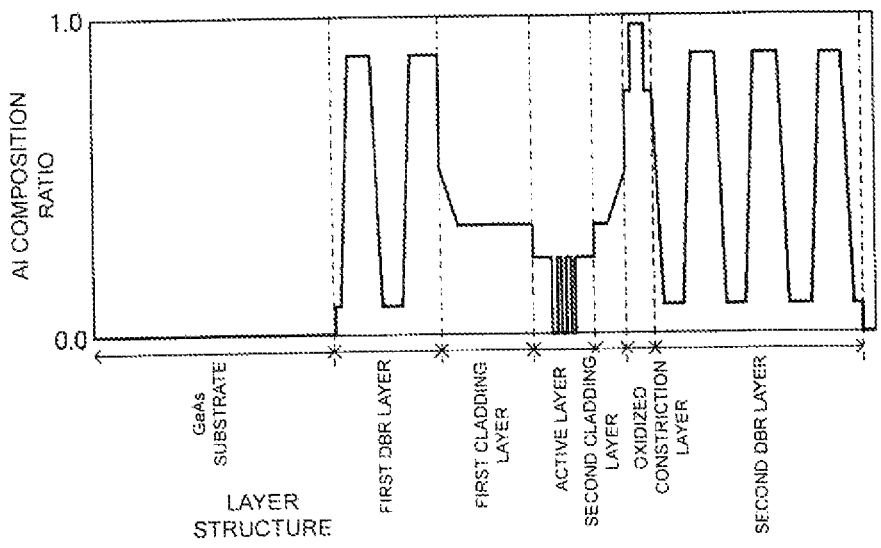

In addition, the cladding layers of the related art whose characteristics are illustrated in FIG. 7 are structured as illustrated in FIG. 8. FIGS. 8(A), 8(B) and 8(C) are distribution diagrams of the Al composition ratios (Al content ratios) of vertical cavity surfaces emitting lasers of the related art. The configuration illustrated in FIG. 8(A) corresponds to related art 1 of FIG. 7 and the Al composition ratio of both cladding layers is constant in the thickness direction. The configuration illustrated in FIG. 8(B) corresponds to related art 2 of FIG. 7 and the Al composition ratio of both cladding layers gradually increases from the active layer side toward the DBR layer side. The configuration illustrated in FIG. 8(C) corresponds to related art 3 of FIG. 7. The Al composition ratio of the first cladding layer gradually increases from the active layer side toward the DBR layer side and the second cladding layer has a two layer structure composed of a high activity energy layer (active layer side) and a low activity energy layer (second DBR layer side).

As illustrated in FIG. 7, in the vertical cavity surface emitting laser 10 of this embodiment, the amount of output light substantially does not change even when electricity is continuously conducted for 1000 hours. That is, the electro-optical conversion efficiency does not decrease regardless of the amount of time for which electricity is conducted. However, in the vertical cavity surface emitting lasers having the configurations of the related art, the amount of output light decreases with the amount of time for which electricity is conducted. That is, the electro-optical conversion efficiency decreases with the amount of time for which electricity is conducted.

As is clear from these experimental results, as illustrated in the present embodiment, a decrease in the electro-optical conversion efficiency with continuous conduction of electricity can be greatly suppressed by providing a low activity energy layer in the first cladding layer 40 and the second cladding layer 60 between which the active layer 50 is interposed.

In addition, in the above description, an example was given in which a low activity energy layer is provided in both of the first cladding layer 40 and the second cladding layer 60, but a decrease in the electro-optical conversion efficiency with continuous conduction of electricity can be suppressed if a low activity energy layer is provided in at least either of the cladding layers.

Next, a vertical cavity surface emitting laser according to a second embodiment of the present disclosure will be described while referring to the drawings. FIG. 9 is an enlarged view of a region in the vicinity of an active layer 50A in a band energy distribution diagram of a vertical cavity surface emitting laser according to the second embodiment of the present disclosure. The vertical cavity surface emitting laser of this embodiment is the same as the vertical cavity surface emitting laser 10 described in the first embodiment, except that the configuration (energy distribution) of the active layer 50A and the configuration (energy distribution) of a first cladding layer 40A are different.

The vertical cavity surface emitting laser of this embodiment is equipped with a barrier layer having an energy gap that is smaller than that of the optical confinement layers between the plurality of quantum wells. With this configuration, an energy gap Eg(CLD1A) of a low activity energy layer of the first cladding layer 40A is set so as to have the following relationship.

The energy gap Eg(CLD1A) of the low activity energy layer of the first cladding layer 40A is set so as to be smaller than an energy gap Eg(BL) of a barrier layer of the active layer 50A and larger than an energy gap Eg(QW) of a quantum well level. In other words, the Al composition ratio of the low activity energy layer of the first cladding layer 40A is set so as to be lower than the Al composition ratio of the barrier layer of the active layer 50A and so as to be higher than the Al composition ratio of a quantum well level.

In the case where a barrier layer is included in the active layer 50A, with this configuration, it is considered that the effect of stress and strain originating in the substrate 20 and the first DBR layer 30 can be suppressed similarly to as in the above-described first embodiment. Thus, a decrease in the electro-optical conversion efficiency with the continuous conduction of electricity can be greatly suppressed.

It is preferable that an energy gap Eg(CLD2A) of a low activity energy layer of a second cladding layer 60A be set so as to be smaller than an energy gap Eg(BL) of a barrier layer of the active layer 50A and larger than an energy gap Eg(QW) of the quantum well level. In other words, the Al composition ratio of the low activity energy layer of the second cladding layer 60A is set so as to be lower than the Al composition ratio of the barrier layer of the active layer 50A and so as to be higher than the Al composition ratio of the quantum well level.

Thus, it is considered that the effect of stress and strain originating in the oxidized constriction layer 70 and the second DBR layer 80 on the active layer 50A can be further suppressed. Thus, a decrease in the electro-optical conversion efficiency with the continuous conduction of electricity can be even more greatly suppressed.

Figure 10:
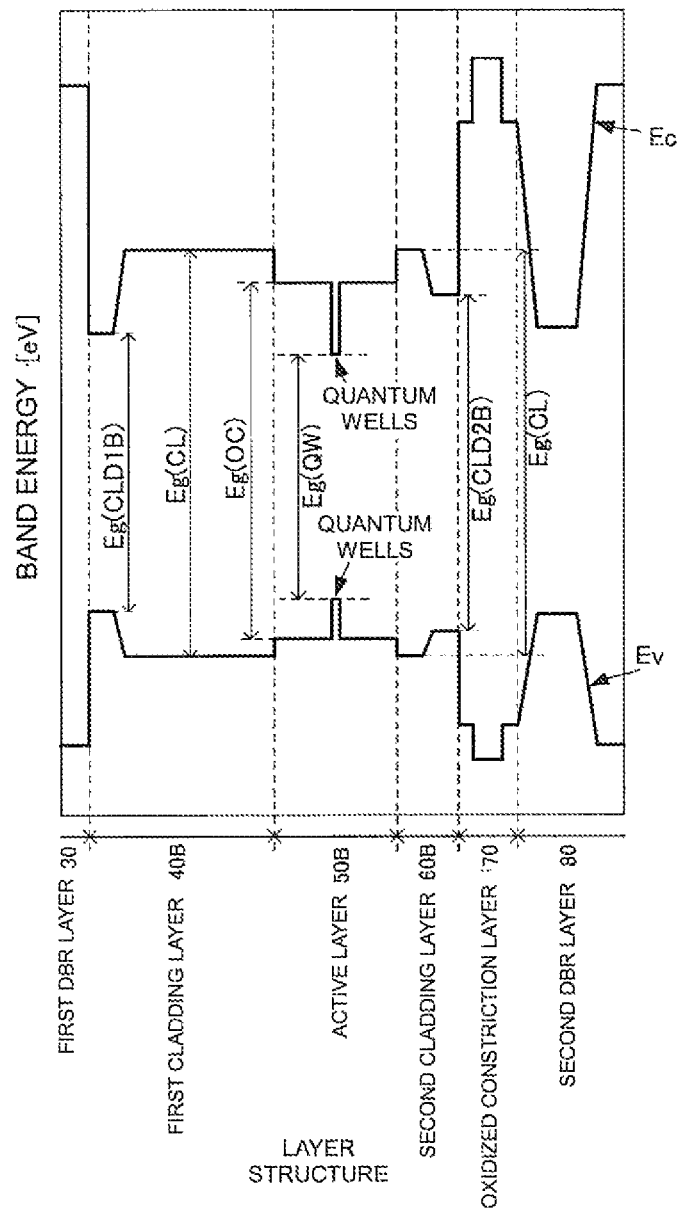
FIG. 10 is an enlarged view of a region in the vicinity of an active layer 50B in a band energy distribution diagram of a vertical cavity surface emitting laser according to a third embodiment of the present disclosure.

Next, a vertical cavity surface emitting laser according to a third embodiment will be described while referring to the drawings. FIG. 10 is an enlarged view of a region in the vicinity of an active layer 50B in a band energy distribution diagram of a vertical cavity surface emitting laser according to the third embodiment of the present disclosure. The vertical cavity surface emitting laser of this embodiment is the same as the vertical cavity surface emitting laser 10 described in the first embodiment, except that the configuration (energy distribution) of an active layer 50B and the configuration (energy distribution) of a first cladding layer 40B are different.

The vertical cavity surface emitting laser of this embodiment includes a single quantum well in the active layer 50B. With this configuration, an energy gap Eg(CLD1B) of a low activity energy layer of the first cladding layer 40B is set so as to have the following relationship.

An energy gap Eg(CLD1B) of the low activity energy layer 42 of the first cladding layer 40B is set so as to be smaller than the energy gap Eg(OC) of the optical confinement layers and so as to be larger than an energy gap Eg(QW) of a quantum well level. In other words, the Al composition ratio of a low activity energy layer of the first cladding layer 40B is set so as to be lower than the Al composition ratio of optical confinement layers of the active layer 50B and so as to be higher than the Al composition ratio of the quantum well level.

With this configuration, it is considered that the effect of stress and strain originating in the substrate 20 and the first DBR layer 30 on the active layer 50B can be suppressed, similarly to as in the above-described first and second embodiments. Thus, a decrease in the electro-optical conversion efficiency with the continuous conduction of electricity can be greatly suppressed.

It is preferable that an energy gap Eg(CLD2B) of a low activity energy layer of a second cladding layer 60B be set so as to be smaller than the energy gap Eg(OC) of the optical confinement layers of the active layer 50B and so as to be larger than an energy gap Eg(QW) of the quantum well level. In other words, it is preferable that the Al composition ratio of the low activity energy layer of the second cladding layer 60B be set so as to be lower than the Al composition ratio of the optical confinement layers of the active layer 50B and so as to be higher than the Al composition ratio of the quantum well level.

Thus, it is considered that the effect of stress and strain originating in the oxidized constriction layer 70 and the second DBR layer 80 on the active layer 50B can be further suppressed. Thus, a decrease in the electro-optical conversion efficiency with the continuous conduction of electricity can be even more greatly suppressed.

In addition, in the above-described embodiments, examples have been described in which a vertical cavity surface emitting laser composed of a semiconductor structure in which AlGaAs is hetero-bonded onto a GaAs substrate, but the above-described configurations can also be applied to a vertical cavity surface emitting laser composed of a hetero-bonded semiconductor structure composed of another material.

The invention claimed is:

1. A vertical cavity surface emitting laser comprising a layered structure including an active layer including a quantum well, a first cladding layer and a second cladding layer between which the active layer is interposed, a first multilayer reflector layer arranged on a side of the first cladding layer opposite to that on which the active layer is arranged, a second multilayer reflector layer arranged on a side of the second cladding layer opposite to that on which the active layer is arranged, a first electrode connected to the first cladding layer, and a second electrode connected to the second cladding layer, at least one of the first cladding layer and the second cladding layer including a low activity energy layer having a band gap that is smaller than a smallest band gap of an optical confinement layer in the quantum well of the active layer and larger than a band gap of the quantum well; wherein further comprising an oxidized constriction layer arranged between the second cladding layer and the second multilayer reflector layer, wherein the low activity energy layer is formed in the second cladding layer.

2. The vertical surface emitting laser according to claim 1, wherein the low activity energy layer of the second cladding layer is formed at a side of the second cladding layer opposite to that on which the active layer is arranged.

3. The vertical surface emitting laser according to claim 1, wherein the low activity energy layer is formed in both the first cladding layer and the second cladding layer.

4. The vertical surface emitting laser according to claim 3, further comprising
a support substrate that is arranged on a side of the first multilayer reflector layer opposite to that on which the first cladding layer is arranged, the band gap of the low activity energy layer formed in the first cladding layer being smaller than the band gap of the low activity energy layer formed in the second cladding layer.

5. The vertical cavity surface emitting laser according to claim 3, wherein the active layer includes a plurality of quantum wells, and
the band gap of the low activity energy layer of the first cladding layer is smaller than the band gap of a barrier layer between the plurality of quantum wells.

6. The vertical surface emitting laser according to claim 5, wherein the band gap of the low activity energy layer of the first cladding layer and the band gap of the low activity energy layer of the second cladding layer are smaller than the band gap of the barrier layer.

7. The vertical cavity surface emitting laser according to claim 1, wherein the low activity energy layer is formed in only the first cladding layer, and
the low activity energy layer of the first cladding layer is formed at a side of the first cladding layer opposite to that on which the active layer is arranged.

8. The vertical surface emitting laser according to claim 1, wherein the low activity energy layer is formed in only the first cladding layer,
the active layer includes a plurality of quantum wells, and
the band gap of the low activity energy layer of the first cladding layer is smaller than a band gap of a barrier layer between the plurality of quantum wells.

9. A vertical cavity surface emitting laser comprising a layered structure including an active layer including a quantum well, a first cladding layer and a second cladding layer between which the active layer is interposed, a first multilayer reflector layer arranged on a side of the first cladding layer opposite to that on which the active layer is arranged, a second multilayer reflector layer arranged on a side of the second cladding layer opposite to that on which the active layer is arranged, a first electrode connected to the first cladding layer, and a second electrode connected to the second cladding layer, the active layer, the first cladding layer, the second cladding layer, the first multilayer reflector layer and the second multilayer reflector layer being composed of a AlGaAs material, and at least one of the first cladding layer and the second cladding layer including a low activity energy layer having an Al composition ratio that is lower than an Al composition ratio of an optical confinement layer in the quantum well of the active layer and higher than an Al composition ratio of the quantum well; wherein further comprising an oxidized constriction layer arranged between the second cladding layer and the second multilayer reflector layer and having an Al composition ratio that is higher than that of the second multilayer reflector layer, wherein the low activity energy layer is formed in the second cladding layer.

10. The vertical surface emitting laser according to claim 9, wherein the low activity energy layer of the second cladding layer is formed at a side of the second cladding layer opposite to that on which the active layer is arranged.

11. The vertical surface emitting laser according to claim 9, wherein the low activity energy layer is formed in both the first cladding layer and the second cladding layer.

12. The vertical surface emitting laser according to claim 11, further comprising
a support substrate that is arranged on a side of the first multilayer reflector layer opposite to that on which the first cladding layer is arranged,
an Al composition ratio of the low activity energy layer formed in the first cladding layer being lower than an Al composition ratio of the low activity energy layer formed in the second cladding layer.

13. The vertical cavity surface emitting laser according to claim 11, wherein the active layer includes a plurality of quantum wells, and
an Al composition ratio of the low activity energy layer of the first cladding layer is lower than an Al composition ratio of a barrier layer between the plurality of quantum wells.

14. The vertical surface emitting laser according to claim 13, wherein the Al composition ratio of the low activity energy layer of the first cladding layer and an Al composition ratio of the low activity energy layer of the second cladding layer are lower than the Al composition ratio of the barrier layer.

15. The vertical cavity surface emitting laser according to claim 9, wherein the low activity energy layer is formed in only the first cladding layer, and
the low activity energy layer of the first cladding layer is formed at a side of the first cladding layer opposite to that on which the active layer is arranged.

16. The vertical surface emitting laser according to claim 9, wherein the low activity energy layer is formed in only the first cladding layer,
the active layer includes a plurality of quantum wells, and
an Al composition ratio of the low activity energy layer of the first cladding layer is lower than an Al composition ratio of a barrier layer between the plurality of quantum wells.

* * * * *